(12) United States Patent
Choi et al.

(10) Patent No.: US 10,615,367 B2
(45) Date of Patent: Apr. 7, 2020

(54) DISPLAY DEVICE HAVING ENCAPSULATION LAYER

(71) Applicant: SAMSUNG DISPLAY CO., LTD., Yongin-si, Gyeonggi-do (KR)

(72) Inventors: Chul Hyun Choi, Yongin-si (KR); Ji Hye Moon, Yongin-si (KR); Sun A Yang, Yongin-si (KR); Hyuk Sang Jun, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/840,449

(22) Filed: Dec. 13, 2017

(65) Prior Publication Data

US 2018/0254433 A1 Sep. 6, 2018

(30) Foreign Application Priority Data

Mar. 6, 2017 (KR) .......................... 10-2017-0028256

(51) Int. Cl.
*H01L 51/52* (2006.01)
*H01L 27/32* (2006.01)

(52) U.S. Cl.
CPC ...... *H01L 51/5253* (2013.01); *H01L 27/3244* (2013.01); *H01L 2251/558* (2013.01)

(58) Field of Classification Search
CPC ............. H01L 51/5253; H01L 27/3244; H01L 2251/558
See application file for complete search history.

(56) References Cited

U.S. PATENT DOCUMENTS

| | | | |
|---|---|---|---|
| 8,665,295 B2 | 3/2014 | Leon et al. | |
| 2015/0090995 A1* | 4/2015 | Jung | H01L 51/5253 257/40 |
| 2015/0236299 A1* | 8/2015 | Kang | H01L 27/3272 257/40 |
| 2016/0064690 A1* | 3/2016 | Kook | H01L 51/5256 257/40 |

FOREIGN PATENT DOCUMENTS

| | | |
|---|---|---|
| KR | 101567424 B1 | 11/2015 |
| KR | 1020160041708 A | 4/2016 |
| KR | 1020160050335 A | 5/2016 |

* cited by examiner

*Primary Examiner* — Thao X Le
*Assistant Examiner* — Xia L Cross
(74) *Attorney, Agent, or Firm* — Cantor Colburn LLP

(57) ABSTRACT

A display device includes: a substrate on which a display area and a non-display area are defined; a plurality of pixels disposed on the substrate in the display area; and an encapsulation layer disposed on the pixels to cover the pixels, where the encapsulation layer including a first region and a second region different from the first region. The encapsulation layers has a thickness in a range of 1.75 μm to 4.0 μm, and the ratio of a thickness of the second region of the encapsulation layer to a thickness of the first region of the encapsulation layer is in a range of 0.95 to 1.0.

16 Claims, 9 Drawing Sheets

DISPLAY DEVICE HAVING ENCAPSULATION LAYER

This application claims priority to Korean Patent Application No. 10-2017-0028256, filed on Mar. 6, 2017, and all the benefits accruing therefrom under 35 U.S.C. 119, the content of which in its entirety is herein incorporated by reference.

BACKGROUND

1. Field

Embodiments of the disclosure relate to a display device, and more particularly, to a display device with high image quality by including an encapsulation layer.

2. Description of the Related Art

An organic light emitting device typically includes a plurality of pixels. Each pixel may include a pair of electrodes and an organic compound layer interposed between the electrodes. When current flows in the electrodes, electrons and holes injected through the electrodes are combined in the organic compound layer, thereby emitting light.

Such an organic light emitting device is typically lightweight, and may be easily manufactured using a relatively small number of components. In addition, the organic light-emitting device may provide high-quality images and have wide viewing angles. Furthermore, the organic light-emitting devices provide high color purity, accurately realize moving images, have low power consumption, and may be operated at low voltage. Due to these desired characteristics, the organic light-emitting devices are widely used for portable electronic devices. The organic light emitting device may include an encapsulation layer to prevent impurities from the outside from being introduced into the pixels thereof.

SUMMARY

Embodiments provide a display device having high image quality.

According to an embodiment of the disclosure, a display device includes: a substrate on which a display area and a non-display area are defined; a plurality of pixels disposed on the substrate in the display area; and an encapsulation layer disposed on the pixels to cover the pixels, where the encapsulation layer includes a first region and a second region different from the first region. In such an embodiment, the encapsulation layers has a thickness in a range of about 1.75 micrometers ($\mu$m) to about 4.0 $\mu$m, and the ratio of a thickness of the second region of the encapsulation layer to a thickness of the first region of the encapsulation layer is in a range of about 0.95 to about 1.0.

In an embodiment, the second region of the encapsulation layer may be disposed along an edge of the display area, and the first region of the encapsulation layer may be surrounded by the second region.

In an embodiment, a width of the second region of the encapsulation layer may be smaller than that of the first region of the encapsulation layer.

In an embodiment, the thickness of the second region of the encapsulation layer may become smaller as the second region of the encapsulation layer is closer to the edge of the display area.

In an embodiment, the first region of the encapsulation layer may have a flat surface parallel to a top surface of the substrate.

In an embodiment, the encapsulation layer may have a multi-layer structure including three or more encapsulation layers, and at least one of the three or more encapsulation layers may include an organic material.

In an embodiment, the encapsulation layer may have a structure in which a first encapsulation layer including an inorganic material, a second encapsulation layer including an organic material, and a third encapsulation layer including an inorganic material are sequentially stacked on one another.

In an embodiment, the first encapsulation layer may have a thickness in a range of about 1.75 $\mu$m to about 4.0 $\mu$m.

In an embodiment, the third encapsulation layer may have a thickness in a range of about 1.75 $\mu$m to about 4.0 $\mu$m, and the second encapsulation layer may have a thickness of about 2.5 $\mu$m or more.

In an embodiment, at least portions of the first encapsulation layer and the third encapsulation layer may be in direct contact with each other.

In an embodiment, a luminance difference between light transmitted through the first region of the encapsulation layer and light transmitted through the second region of the encapsulation layer may be 2% or less.

In an embodiment, the pixel may emit light having a wavelength band of at least one color selected from red, green, blue, white, yellow, cyan, and magenta, and a color difference between light transmitted through the first region of the encapsulation layer and light transmitted through the second region of the encapsulation layer may be 0.001 or less.

In an embodiment, the pixel may include: a first electrode disposed on the substrate; an emitting layer disposed on the first electrode; and a second electrode disposed on the emitting layer.

In an embodiment, the first electrode may be an anode, and the second electrode may be a cathode.

In an embodiment, the first region and the second region of the encapsulation may be disposed in the display area.

In an embodiment, a portion of the encapsulation layer may be disposed in the non-display area.

In an embodiment, the encapsulation layer disposed in the non-display area may include an inorganic material.

BRIEF DESCRIPTION OF THE DRAWINGS

The above and other features of the invention will become more apparent by describing in further detail exemplary embodiments thereof with reference to the accompanying drawings, in which.

DETAILED DESCRIPTION

Figure 1:
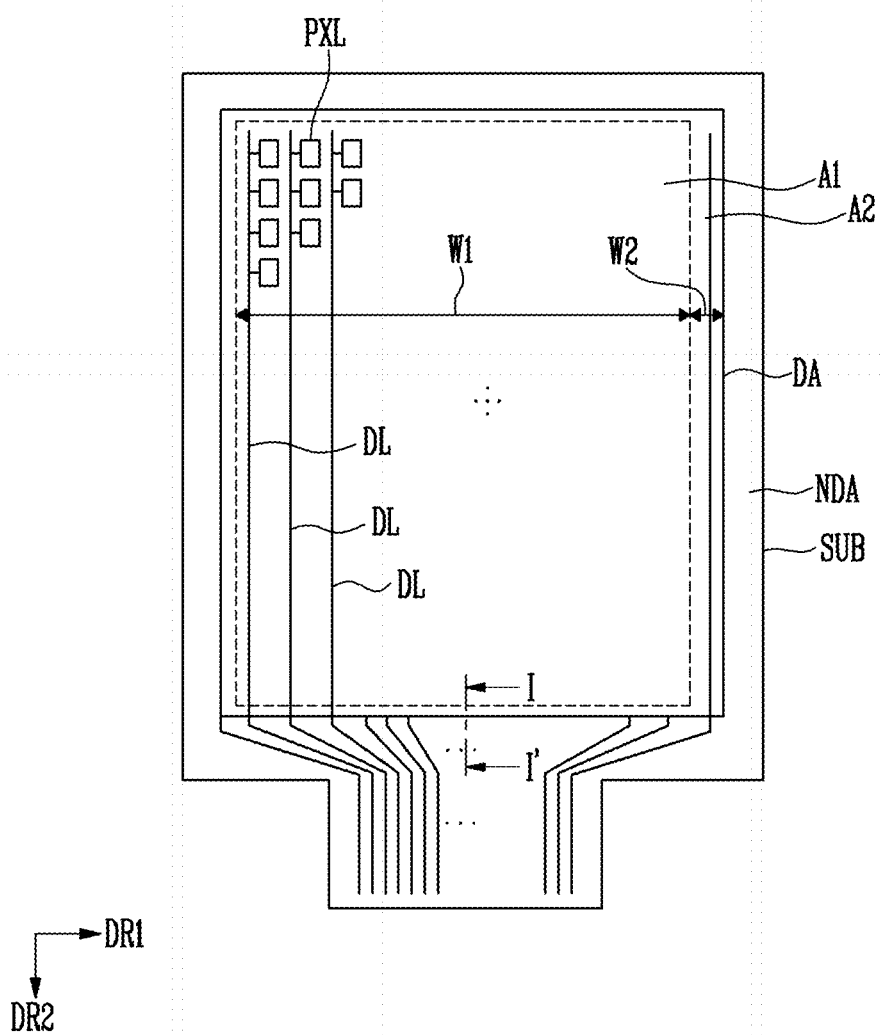
FIG. 1 is a plan view illustrating a display device according to an embodiment of the disclosure.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first", "second", etc. may be used herein to describe various elements, components, regions, layers and/or sections, these elements should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the disclosure will be described in detail with reference to the accompanying drawings.

FIG. 1 is a plan view illustrating a display device according to an embodiment of the disclosure.

An embodiment of the display device includes a substrate SUB, pixels PXL disposed on the substrate SUB, and a line unit connected to the pixels PXL. The line unit includes data lines DL, gate lines, scan lines, a power line and the like.

The substrate SUB includes a display area DA and a non-display area NDA surrounding at least one side of the display area DA.

The substrate SUB may have an approximately quadrangular shape, particularly, a rectangular shape. In an embodiment of the disclosure, the substrate SUB may include a pair of short sides parallel to each other in a first direction DR1 and a pair of long sides parallel to each other in a second direction DR2 crossing, e.g., perpendicular to, the first direction DR1.

However, the shape of the substrate SUB is not limited thereto, and the substrate SUB may have various shapes. In one embodiment, for example, the substrate SUB may be in one of various shapes such as a closed polygon including linear sides, a circle, an ellipse, etc., including curved sides, and a semicircle, a semi-ellipse, etc., including linear and curved sides. In an embodiment of the disclosure, where the substrate SUB has linear sides, at least one portion of corners of each of the shapes may be curved. In one embodiment, for example, where the substrate SUB has a rectangular shape, a portion at which adjacent linear sides meet each other may be replaced with a curve having a predetermined curvature. In such an embodiment, a vertex portion of the rectangular shape may be formed with a curved side having both adjacent ends respectively connected to two adjacent linear sides, the curved side having a predetermined curvature. The curvature may be differently set depending on a position. In one embodiment, for example, the curvature may be changed depending on a position at which the curve is started, a length of the curve, etc.

The display area DA is a region, in which a plurality of pixels is disposed to display an image. The display area DA may be in a shape corresponding to a shape of the substrate SUB. In one embodiment, for example, the display area DA may be in one of various shapes such as a closed polygon including linear sides, a circle, an ellipse, etc., including curved sides, and a semicircle, a semi-ellipse, etc., including linear and curved sides. In an embodiment of the disclosure, where the display area DA has linear sides, at least a portion of corners of each of the shapes may be curved.

The pixels PXL are disposed on the display area DA of the substrate SUB. Each pixel PXL is a basic unit for displaying an image, and may be provided in plural. Each pixel PXL may emit white light and/or colored light. Each pixel PXL may emit light of one of red, green and blue, for example. However, the disclosure is not limited thereto, and each pixel PXL may emit light of another color such as cyan, magenta, or yellow.

The pixels PXL may be light emitting devices each including an organic emitting layer. However, the disclosure is not limited thereto, and the pixels PXL may be implemented in various forms.

According to an embodiment of the disclosure, as shown in FIG. 1, the display area DA may be divided into a first region A1 and a second region A2. In such an embodiment, the second region A2 of the display area DA may be disposed along an edge of the display area DA, and the first region A1 of the display area DA may be surrounded by the second region A2. Here, the edge of the display area DA means an end of the display area DA and a display area adjacent to the end. The second region A2 is disposed at the edge of the display area DA. The width of the edge may be changed depending on the thickness of an encapsulation layer and a change in thickness of the encapsulation layer depending on the distance from the end of the display area DA. The second region A2 may mean a region in which the change in thickness of the encapsulation layer depending on the distance from the end of the display area DA is relatively large, and the first region A1 may mean a region in which the change in thickness of the encapsulation layer depending on the distance from the end of the display area DA is relatively small. Therefore, the width of the edge or the width W2 of the second region A2 may be changed depending on the change in thickness of the encapsulation layer depending on the distance from the end of the display area DA.

In such an embodiment, where the second region A2 is disposed along the edge of the display area DA, the second region A2 may be disposed between an end of the first region A1 and the end of the display area DA. Therefore, the second region A may be in the shape of a ring with an open center. In such an embodiment, the shape of the ring may be changed depending on the shape of the display area DA and the shape of the first region A1. In one embodiment, for example, where both of the display area DA and the first region A1 have circular shapes, the second region A2 may have a circular ring shape such as a donut shape. In an alternative embodiment, where both of the display area DA and the first region A1 have rectangular shapes, the second region A2 may have a quadrangular ring shape.

The shape of the second region A2 may be symmetrical or asymmetrical. In an embodiment, where the shape of the second region A2 is asymmetrical, the width of the second region A2, i.e., the shortest distance from the end of the first region A1 to the end of the display area DA, may be changed depending on positions. In such an embodiment, where the second region A2 is symmetrical or asymmetrical, the width W2 of the second region A2 may be smaller than that W1 of the first region A1. Therefore, the area of the second region A2 in the display area DA, is smaller than the area of the first region A1 in the display area DA, when viewed from a plan view in a thickness direction thereof, i.e., a direction perpendicular to the first direction DR1 and the second direction DR2.

Figure 2:
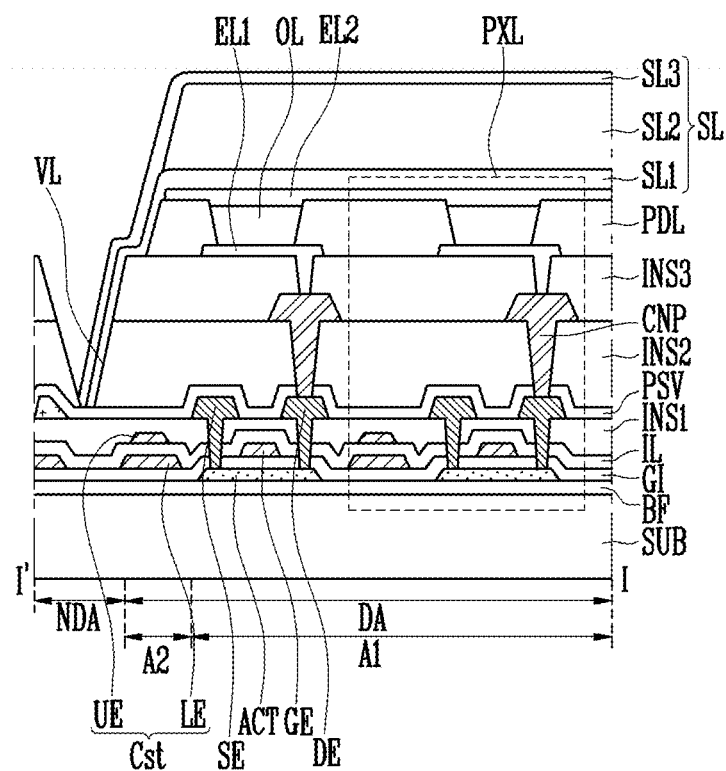
FIG. 2 is a cross-sectional view taken along line I-I' of the display device shown in FIG. 1.

FIG. 2 is a cross-sectional view taken along line I-I' of the display device shown in FIG. 1.

As shown in FIG. 2, an embodiment of the display device includes a substrate SUB including a display area DA and a non-display area NDA, a plurality of pixels PXL arranged on the display area DA of the substrate SUB, and an encapsulation layer SL that is disposed on the pixels PXL to cover the pixels PXL, where the display area DA is divided into a first region A1 and a second region A2 different from the first region A1.

The encapsulation layer SL is disposed over the pixels PXL to cover the pixels PXL. In such an embodiment, the encapsulation layer SL effectively prevents moisture or air from penetrating into the pixels PXL. In such an embodiment, the encapsulation layer SL may have elasticity or flexibility, such that the encapsulation layer SL may protect the pixels PXL from external impact. The encapsulation layer SL may have a single-layer structure or a multi-layer structure.

In an embodiment, where the encapsulation layer SL have a multi-layer structure, the encapsulation layer SL may include three or more encapsulation layers, at least one of the three or more encapsulation layers may include an organic material. In such an embodiment, the encapsulation layer including the organic material may be an encapsulation layer located at the inner most position among the three or more encapsulation layers of the encapsulation layer SL having the multi-layer structure. In an embodiment, referring to FIG. 2, the encapsulation layer SL includes a first encapsulation layer SL1, a second encapsulation layer SL2 and a third encapsulation layer SL3. In such an embodiment, the second encapsulation layer SL2 may include an organic material. In such an embodiment, where the second encapsulation layer SL2 includes the organic material, the first encapsulation layer SL1 and the third encapsulation layer SL3 may include an inorganic material. In such an embodiment, the encapsulation layer SL may have a structure in which the first encapsulation layer SL1 including the inorganic material, the second encapsulation layer SL2 including the organic material, and the third encapsulation layer SL3 including the inorganic material are sequentially stacked. In such an embodiment, where the encapsulation layer SL has a structure in which the encapsulation layer SL2 including the organic material is stacked between the encapsulation layer SL1 and SL3 including the inorganic material, such that weak points of the encapsulation layers SL1, SL2 and SL3 may be effectively complemented. In general, the encapsulation layer including an inorganic material may effectively prevent penetration of external moisture or oxygen, but may vulnerable to creaks due to low elasticity or flexibility. In addition, an encapsulation layer including an organic material has high elasticity or flexibility, but may not effectively prevent penetration of external moisture or oxygen. In an embodiment, the encapsulation layer SL includes the encapsulation layers SL1 and SL3 including the inorganic material and the encapsulation layer SL2 including the organic material and stacked therebetween, such that the encapsulation layer SL may be effectively prevented from being cracked and prevent crack and penetration of oxygen and moisture therethrough.

In an embodiment of the disclosure, the organic material may be an organic insulating material including a polyacryl-based compound, a polyimide-based compound, a fluorine-based compound, such as Teflon®, a benzocyclobutene-based compound or the like. In an embodiment, the inorganic material may be an inorganic insulating material including polysiloxane, silicon nitride, silicon oxide, silicon oxynitride or the like. In an embodiment, the second encapsulation layer SL2 may include at least one of various silicon-based insulating materials, e.g., hexamethyldisiloxane ("HMDSO"), octamethylcyclotetrasiloxane ("OMCTSO"), tetramethyldisiloxane ("TMDSO"), tetraethylorthosilicate ("TEOS") and the like.

According to an embodiment, as shown in FIG. 2, at least portions of the first encapsulation layer SL1 and the third encapsulation layer SL3 may be in direct contact with each other. In such an embodiment, the second encapsulation layer SL2 including the organic material is not provided in a region in which the first encapsulation layer SL1 and the third encapsulation layer SL3 are in direct contact with each other. In such an embodiment, the region in which the first encapsulation layer SL1 and the third encapsulation layer SL3 are in direct contact with each other may include a valley VL. The valley VL may be formed by removing a portion of an organic insulating layer along a circumference of the display area DA, and be provided on the non-display area NDA. In such an embodiment, the first encapsulation layer SL1 and the third encapsulation layer SL3 cover a top surface of the valley VL, such that the first encapsulation layer SL1 and the third encapsulation layer SL3 effectively prevent external moisture or oxygen from penetrating into the pixel PXL through the organic insulating layer. Therefore, at least a portion of the encapsulation layer SL may be disposed on the non-display area NDA to prevent external moisture or oxygen from penetrating into the pixel PXL. In an embodiment, the encapsulation layers SL1 and SL3 disposed on the non-display area NDA may include an organic material.

In an embodiment, as shown in FIG. 2, the first region A1 and the second region A2 may be defined in the display area DA. In such an embodiment, the second region A2 may mean a region in which a change in thickness of the encapsulation layer depending on the distance from an end of the display area DA is relatively large. In such an embodiment, the first region A1 may mean a region in which the change in thickness of the encapsulation layer depending on the distance from the end of the display area DA is relatively small. In an embodiment, as shown in FIG. 2, the second region A2 is located at an edge of the display area DA. In such an embodiment, the edge of the display area DA is in contact with the valley VL provided on the non-display area NDA. The encapsulation layer SL covering the valley VL, particularly, the first encapsulation layer SL1 and the third encapsulation layer SL3, have an inclination similar to that of the valley VL, and hence the thickness of the first encapsulation layer SL1 and the third encapsulation layer SL3 may decrease at the edge of the display area DA or on the second region A2. In such an embodiment, when viewed on a plane, the thickness of the encapsulation layers SL1 and SL3 in the second region A2 may become smaller as the encapsulation layers SL1 and SL3 become closer to the edge of the display area DA. In such an embodiment, the decrease in thickness of the first encapsulation layer SL1 and the third encapsulation layer SL3 may become a factor that deteriorates the quality of an image output from the display device as will be described later with reference to FIGS. 3A to 3D.

However, according to the disclosure, at least one layer in the encapsulation layer SL has a thickness in a range of about 1.75 micrometers (μm) to about 4.0 μm, and the ratio of the thickness of a portion of the encapsulation layer SL in the second region A2 (also referred to as the second region of the encapsulation layer) to the thickness of a portion of the encapsulation layer SL in the first region A1 (also referred to as the first region of the encapsulation layer) is in a range of about 0.95 to about 1.0, so that degradation of the quality of an image output from the display device may not occur. This will be described in detail later with reference to FIGS. 6A and 6B.

The portion of the encapsulation layer SL in the first region A1 may have a flat surface parallel to the substrate SUB. Here, the flat surface has a meaning including a substantially flat surface. As shown in FIG. 2, the flat surface may be provided by a top surface of the encapsulation layer SL. In such an embodiment, where the portion of the encapsulation layer SL in the first region A1 has a flat surface substantially parallel to the substrate SUB, the thickness of the portion of the encapsulation layer SL in the first region A1 is substantially constant. In such an embodiment, where the thickness of the portion of the encapsulation layer SL in the first region A1 is substantially constant, a color difference or luminance difference caused by a difference in thickness of the encapsulation layer SL may not occur in the first region A1.

According to an embodiment of the disclosure, the luminance difference between light transmitted through the encapsulation layer SL of the first region A1 and light transmitted through the encapsulation layer SL of the second region A2 may be about 2% or less. When the luminance difference between lights output from different regions of the display area is large, the luminance difference may be viewed as a stain by a user. Such a stain considerably deteriorates the quality of an image output from the display device. According to an embodiment of the disclosure, the luminance difference between light transmitted through the encapsulation layer SL of the first region A1 and light transmitted through the encapsulation layer SL of the second region A2 is about 2% or less, such that a stain caused by the luminance difference is not viewed by the user. Thus, in such an embodiment, a high-quality image may be output with no stain.

According to an embodiment of the disclosure, the pixel PXL may emit light having a wavelength band of light of at least one color selected from red, green, blue, white, yellow, cyan and magenta, and the color difference between light transmitted through the encapsulation layer SL of the first region A1 and light transmitted through the encapsulation layer SL of the second region A2 may be 0.001 or less. Here, the color difference means a difference between color coordinate values according to a commission internationale de L'eclairage ("CIE") xy coordinate system or a CIE u'v' coordinate system. When the luminance difference between lights output from different regions of the display area is large, the color difference may be viewed as a stain by the user. Such a stain considerably deteriorates the quality of an image output from the display device. According to an embodiment of the disclosure, since the color difference between light transmitted through the encapsulation layer SL of the first region A1 and light transmitted through the encapsulation layer SL of the second region A2 is 0.001 or less, such that a stain caused by the color difference is not viewed by the user. Thus, in such an embodiment, a high-quality image may be output with no stain.

Hereinafter, other components included in the display device according to an embodiment of the disclosure will be described with reference to FIG. 2.

In an embodiment, the substrate SUB may include or be made of an insulative material such as glass or resin. In such an embodiment, the substrate SUB may include or be made of a material having flexibility to be bendable or foldable. The substrate SUB may have a single-layer or multi-layer structure.

In one embodiment, for example, the substrate SUB may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, cellulose acetate propionate and polyurethane. However, the material constituting the substrate SUB may be variously modified. In an alternative embodiment, the substrate SUB may include or be made of fiber glass reinforced plastic ("FRP"), or the like.

A buffer layer BF is disposed on the substrate SUB. The buffer layer BF effectively prevents impurities from being diffused into switching and driving transistors. The buffer layer BF may have a single layer structure, but not being limited thereto. Alternatively, buffer layer BF may have a multi-layer structure including at least two layers.

The buffer layer BF may be an inorganic insulating layer including or made of an inorganic material. In one embodiment, for example, the buffer layer BF may include or be formed of silicon nitride, silicon oxide, silicon oxynitride, etc. When the buffer layer BF is provided as a multi-layer, layers of the multi-layer may include or be formed of materials equal to or different from each other. The buffer layer BF may be omitted according to material and process conditions.

Active patterns ACT are provided on the buffer layer BF. The active patterns ACT include or are formed of a semiconductor material. Each of the active patterns may include a source region, a drain region, and a channel region provided between the source region and the drain region. The active pattern ACT may be a semiconductor pattern including or made of a poly-silicon, an amorphous silicon or an oxide semiconductor, for example. The channel region is a semiconductor pattern undoped with impurities, and may be an intrinsic semiconductor. The source region and the drain region are semiconductor patterns dope with impurities. The impurities may include impurities such as an n-type impurity, a p-type impurity, and other metals.

A gate insulating layer GI is disposed over the active pattern ACT. The gate insulating layer GI may be an inorganic insulating layer including or made of an inorganic material, or an organic insulating layer including or made of an organic material. The inorganic material may include an inorganic insulating material including at least one of polysiloxane, silicon nitride, silicon oxide and silicon oxynitride, for example. The organic material may include at least one of a polyacryl-based compound, a polyimide-based compound, a fluorine-based polymer compound including Teflon® and a benzocyclobutene-based compound, for example.

A gate electrode GE and a capacitor lower electrode LE are disposed on the gate insulating layer GI. The gate electrode GE is disposed to cover a region corresponding to the channel region of the active pattern ACT.

The gate electrode GE and the capacitor lower electrode LE may be include or made of a metal. In one embodiment, for example, the gate electrode GE may include or be made of at least one of gold (Au), silver (Ag), aluminum (Al), molybdenum (Mo), chromium (Cr), titanium (Ti), nickel (Ni), neodymium (Nd), and copper (Cu), and an alloy thereof. In an embodiment, the gate electrode GE may have a single layer structure. However, the disclosure is not limited thereto, and alternatively, the gate electrode GE may have a multi-layer structure, in which two or more layers including different materials among the metals and the alloys thereof, respectively, are stacked one on another.

In an embodiment of the disclosure, although not shown in the drawing, other lines including gate lines may include or be formed of a same material and in a same layer as the gate electrode GE and the capacitor lower electrode LE. In such an embodiment, the other lines including the gate lines may be directly or indirectly connected to a portion of the transistor in each pixel PXL, e.g., the gate electrode GE.

An interlayer insulating layer IL is disposed over the gate electrode GE and the capacitor lower electrode LE. The interlayer insulating layer IL may be an inorganic insulating layer including or made of an inorganic material. The inorganic material may include at least one of polysiloxane, silicon nitride, silicon oxide and silicon oxynitride.

A capacitor upper electrode UE is disposed on the interlayer insulating layer IL. The capacitor upper electrode UE may include or be made of a metal. In one embodiment, for example, the capacitor upper electrode UE may include or be made of at least one of gold (Au), silver (Ag), aluminum (Al), molybdenum (Mo), chromium (Cr), titanium (Ti), nickel (Ni), neodymium (Nd), and copper (Cu), and an alloy thereof. In an embodiment, the capacitor upper electrode UE may have a single layer structure. However, the disclosure is not limited thereto, and alternatively, the capacitor upper electrode UE may have a multi-layer structure in which two or more layers including different materials among the metals and the alloys thereof, respectively, are stacked on one another.

The capacitor lower electrode LE and the capacitor upper electrode UE constitute a capacitor Cst with the interlayer insulating layer IL interposed therebetween. In an embodiment of the disclosure, as shown in FIG. 2, the capacitor Cst may be defined by the capacitor lower electrode LE and the capacitor upper electrode UE. However, the disclosure is not limited thereto, and the capacitor Cst may be implemented in various manners.

A first insulating layer INS1 is provided over the capacitor upper electrode UE. The first insulating layer INS1 may be an inorganic insulating layer including or made of an inorganic material. The inorganic material may include at least one of polysiloxane, silicon nitride, silicon oxide and silicon oxynitride.

A source electrode SE and a drain electrode DE may be disposed on the first insulating layer INS1. The source electrode SE and the drain electrode DE are in contact with the source region and the drain region of the active pattern ACT through contact holes defined in the interlayer insulating layer IL and the gate insulating layer GI.

The source electrode SE and the drain electrode DE may include or be made of a metal. In one embodiment, for example, the source electrode SE and the drain electrode DE may include or be made of at least one of gold (Au), silver (Ag), aluminum (Al), molybdenum (Mo), chromium (Cr), titanium (Ti), nickel (Ni), neodymium (Nd), and copper (Cu), and an alloy thereof. In such an embodiment, the source electrode SE and the drain electrode DE may have a single layer structure. However, the disclosure is not limited thereto, and alternatively, the source electrode SE and the drain electrode DE may have a multi-layer structure in which two or more layers including different materials among the metals and the alloys, respectively, are stacked on one another.

In an embodiment of the disclosure, although not shown in the drawing, data lines or first power lines may include or be formed of a same material and in a same layer as the source electrode SE and the drain electrode DE. In such an embodiment, the data lines or the first power lines may be directly or indirectly connected to a portion of the transistor in each pixel PXL, e.g., the source electrode SE and/or the drain electrode DE.

A passivation layer PSV may be disposed over the source electrode SE and the drain electrode DE. The passivation layer PSV may be an inorganic insulating layer including or made of an inorganic material. The inorganic material may include polysiloxane, silicon nitride, silicon oxide, and silicon oxynitride. In some embodiments, the passivation layer PSV may be omitted.

A second insulating layer INS2 may be disposed on the passivation layer PSV. In an embodiment, where the passivation layer PSV is omitted, the second insulating layer INS2 may be disposed on the first insulating layer INS1.

The second insulating layer INS2 is an organic insulating layer including or made of an organic material. The organic material may include an organic insulating material, such as a polyacryl-based compound, a polyimide-based compound, a fluorine-based polymer compound including Teflon®, and a benzocyclobutene-based compound.

A connection pattern CNP may be disposed on the second insulating layer INS2. The connection pattern CNP is connected to the drain electrode DE of the transistor through a contact hole defined through the second insulating layer INS2 and the passivation layer PSV. In one embodiment, for example, the connection pattern CNP may include or be made of at least one of metals such as gold (Au), silver (Ag), aluminum (Al), molybdenum (Mo), chromium (Cr), titanium (Ti), nickel (Ni), neodymium (Nd), and copper (Cu), or alloys of the metals. In such an embodiment, the connection pattern CNP may have a single layer. However, the disclosure is not limited thereto, and alternatively, the connection pattern CNP may have a multi-layer structure in which two or more layer including different materials among the metals and the alloys thereof, respectively, are stacked on one another.

In an embodiment of the disclosure, although not shown in the drawing, other lines including a dummy power line and the like may include or be formed of a same material and in a same layer as the connection pattern CNP.

A third insulating layer INS3 may be disposed over the connection pattern CNP. The third insulating layer INS3 may be an organic insulating layer including or made of an organic material. The organic material may include organic insulating materials such as a polyacryl-based compound, a polyimide-based compound, a fluorine-based polymer compound including Teflon® and a benzocyclobutene-based compound.

A first electrode EL1 may be disposed on the third insulating layer INS3. The first electrode EL1 is connected to the connection pattern CNP through a contact hole defined through the third insulating layer INS3, and is connected to the drain electrode DE through a contact hole passing through the second insulating layer INS2 and the passivation layer PSV. Accordingly, the first electrode EL1 is connected to the transistor. Here, in some embodiments, the first electrode EL1 may be one of an anode or a cathode.

In an embodiment of the disclosure, as shown in FIG. 2, the organic insulating layer constituting the second insulating layer INS2 and the third insulating layer INS3 is disposed on the passivation layer PSV, but the disposition of the organic insulating layer is not limited thereto. In an alternative embodiment of the disclosure, only one organic insulating layer may be disposed between the passivation layer PSV and the first electrode EL1. In such an embodiment, only one organic insulating layer may be disposed on the passivation layer PSV, and the first electrode EL1 may be disposed on the organic insulating layer. In an alternative embodiment, the connection pattern CNP may be omitted, and the first electrode EL1 may be directly connected to the drain electrode DE through a contact hole defined in the organic insulating layer. Hereinafter, even in an embodiment in which the organic insulating layer is formed with two layers including the second insulating layer INS2 and the third insulating layer INS3, the embodiment includes a case the organic insulating layer is formed as one organic insulating layer that is not separated into the two layers as well as the case where the organic insulating layer is separated into the two layers.

The first electrode EL1 may include or be formed of a metal layer such as Ag, Mg, Al, Pt, Au, Ni, Nd, Ir, Cr, or any alloy thereof and/or indium tin oxide ("ITO"), indium zinc oxide ("IZO"), zinc oxide (ZnO), indium tin zinc oxide ("ITZO"), etc.

In an embodiment of the disclosure, the first electrode EL1 may include or be formed of a kind of metal. However, the disclosure is not limited thereto, and the first electrode EL1 may include or be formed of an alloy of two or more kinds of metals, e.g., Ag and Mg.

When an image is displayed or output toward the lower direction of the substrate SUB, the first electrode EL1 may be formed as a transparent conductive layer. When an image is to be provided in the upper direction of the substrate SUB, the first electrode EL1 may be formed as a metal reflective layer and/or a transparent conductive layer.

A pixel defining layer PDL that defines a pixel region to correspond to each pixel PXL may be provided on the substrate SUB on which the first electrode EL1 and the like are formed. The pixel defining layer PDL may be an organic insulating layer including or made of an organic material. The organic material may include organic insulating materials such as a polyacryl-based compound, a polyimide-based compound, a fluorine-based polymer compound including Teflon® and a benzocyclobutene-based compound.

The pixel defining layer PDL exposes an upper surface of the first electrode EL1 and protrudes from the substrate SUB along the circumference of the pixel PXL.

An organic emitting layer OL may be provided in the region of the pixel PXL surrounded by the pixel defining layer PDL.

The organic emitting layer OL may include a low-molecular or high-molecular material. The low-molecular material may include copper phthalocyanine ("CuPc"), N,N'-Di(naphthalene-1-yl)-N,N'-diphenyl-benzidine ("NPB"), tris-8-hydroxyquinoline aluminum ("Alq$_3$"), and the like. These low-molecular materials may be formed through a vacuum deposition. The high-molecular material may include at least one of a poly(3,4-ethylenedioxythiophene ("PEDOT")-based material, a poly(phenylene-vinylene) ("PPV")-based material, a poly(fluorine)-based material.

The organic emitting layer OL may have a single layer structure, or a multi-layer structure including layers having various functions. In an embodiment, where the organic emitting layer OL has a multi-layer structure, the organic emitting layer OL may have a structure in which a hole injection layer, a hole transport layer, an emission layer, an electron transport layer, an electron injection layer, and the like are stacked in a single or complex structure. The organic emitting layer OL may be formed through an evaporation, a screen printing, an inkjet printing, a laser induced thermal imaging ("LITI"), or the like.

The organic emitting layer OL is not limited thereto, and the organic emitting layer OL may have one of various structures. In an embodiment, at least one portion of the organic emitting layer OL may integrally formed throughout a plurality of first electrodes EL1, or be individually provided to respectively correspond to a plurality of first electrodes EL1.

A second electrode EL2 is disposed on the organic emitting layer OL. The second electrode EL2 may be provided for each pixel PXL, or be provided to cover a majority of the display area DA. The second electrode EL2 may be shared by a plurality of pixels.

In some embodiments, the second electrode EL2 may be one of the anode and the cathode. In an embodiment, where the first electrode EL1 is the anode, the second electrode EL2 may be the cathode. In an embodiment, where the first electrode EL1 is the cathode, the second electrode EL2 may be the anode.

The second electrode EL2 may include or be formed of a metal layer including at least one of Ag, Mg, Al, Pt, Pd, Au, Ni, Nd, Ir, Cr and an alloy thereof, and/or a transparent conductive layer such as ITO, IZO, zinc oxide ZnO, or ITZO. In an embodiment of the disclosure, the second electrode EL2 may have a multi-layer structure of two or more layers including a metal thin film. In one embodiment, for example, the second electrode EL2 may be formed as a triple layer of ITO/Ag/ITO.

In an embodiment, where an image is output in the lower direction of the substrate SUB, the second electrode EL2 may include a metal reflective layer and/or a transparent conductive layer. In an embodiment, where an image is output in the upper direction of the substrate SUB, the second electrode EL2 may include or be formed as a transparent conductive layer.

Figure 3A:
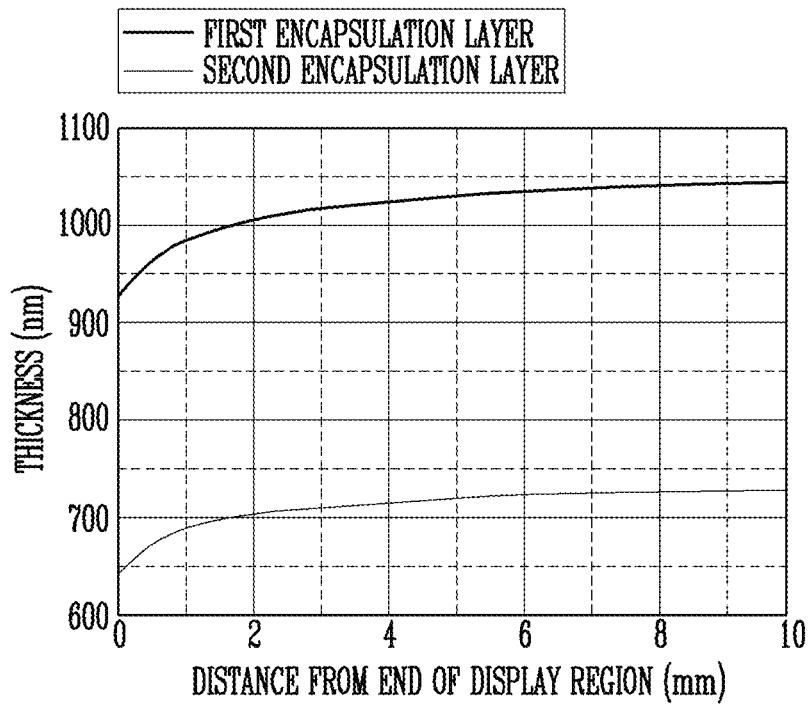
FIG. 3A is a graph illustrating thicknesses of an encapsulation layer in a conventional display device.

FIG. 3A is a graph illustrating thicknesses of an encapsulation layer in a conventional display device. Specifically, FIG. 3A illustrates thicknesses of a first encapsulation layer and a second encapsulation layer depending on the distance from an end of a display area in a conventional display device. In a conventional display device as shown in FIG. 3A, the thicknesses of the first encapsulation layer and the second encapsulation layer are smallest at the end of the display area. In addition, as the first encapsulation layer and the second encapsulation layer are distant from the end of the display area, the thicknesses of the first encapsulation layer and the second encapsulation layer gradually increase. However, as shown in the graph of FIG. 3A, the increment of the thickness of the encapsulation layer depending on the distance from the end of the display area may be changed. In one embodiment, for example, the increment of the thickness of the encapsulation layer may gradually decrease as the encapsulation layer is distant from the end of the display area. If the encapsulation layer is sufficiently distant from the display area, the thickness of the encapsulation layer may converge to a certain numerical value.

A change in thickness of the encapsulation layer depending on the position of the encapsulation layer in the display area may depend on characteristics of a process of forming the encapsulation layer. When the encapsulation layer is formed using a deposition process, a small amount of material of the encapsulation layer may be deposited at the end of the display area as compared with another region of the encapsulation layer. A difference in deposition degree may result from a difference in thickness of the deposited encapsulation layer. Therefore, as shown in FIG. 3A, the thickness of the encapsulation layer may be relatively small at the end of the display area, at which a small amount of material of the encapsulation layer is deposited. As the encapsulation layer is distance from the end of the display area, the material of the encapsulation layer may be relatively uniformly deposited. Thus, the increment of the thickness of the encapsulation layer decreases as the encapsulation layer is distant from the end of the display area, and the thickness of the encapsulation layer converges to a target value.

In FIG. 3A, the thickness of the first encapsulation layer is considerably changed depending on the distance from the end of the display area. Specifically, the ratio of a thickness of the first encapsulation layer at a position distant by about 10 millimeters (mm) from the end of the display area to a thickness of the first encapsulation layer at the end of the display area about 0.9. When the thickness of the encapsulation layer is considerably changed depending on the distance from the end of the display area, a color difference and a luminance difference may occur as will be described later. Therefore, the quality of an image output from the conventional display device may be considerably deteriorated. This will be described in detail later with reference to FIGS. 3B to 3D.

Figure 3B:
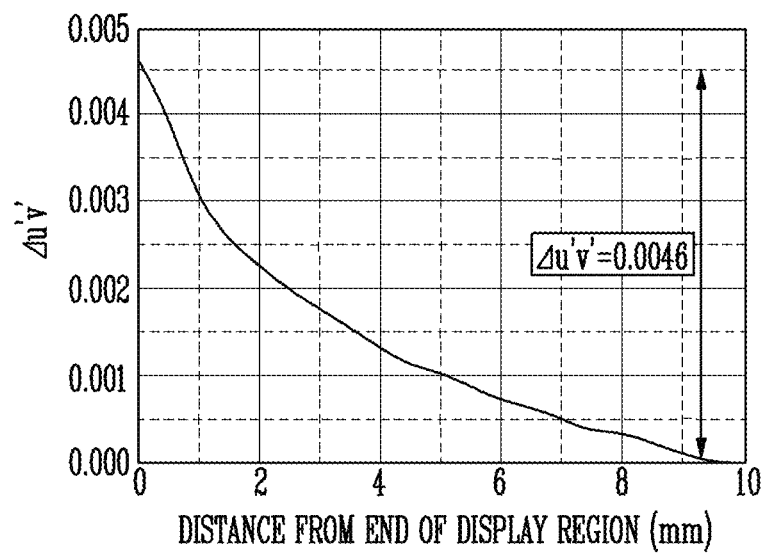
FIGS. 3B to 3D are graphs illustrating change in luminance and color coordinate with respect to position of the conventional display device of FIG. 3A.
Figure 3C:
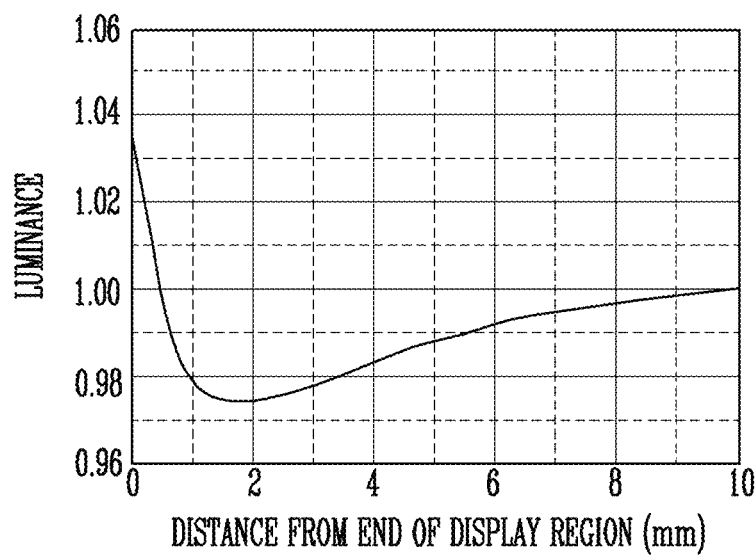
Figure 3D:
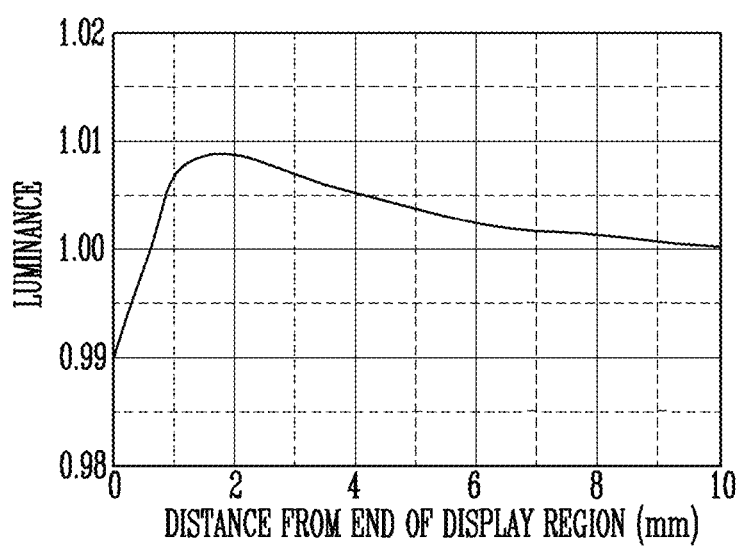

FIGS. 3B to 3D are graphs illustrating change in luminance and color coordinate with respect to position of the conventional display device of FIG. 3A. Specifically, FIGS. 3B to 3D illustrate changes in color coordinate value or luminance depending on the distance from the end of the display area. FIGS. 3B and 3D illustrate a case where light having a wavelength band of white light is emitted from a pixel.

As shown in the graph of FIG. 3B, when light having a wavelength band of white light is emitted from the display device, the color coordinate vale of the light output from the display device is considerably changed as the light is distant from the end of the display area.

Referring to FIG. 3B, when the display device emits light having a wavelength band of white light, a difference between a color coordinate vale of light output at a point distant by about 10 mm from the end of the display area and a color coordinate value of light output at a point distant by about 0.3 mm from the end of the display area or a color difference $\Delta u'v'$ is about 0.0046. Here, u'v' means a color coordinate value in the CIE u'v' coordinate system. Therefore, when a difference between color coordinate values or a color difference $\Delta u'v'$ exists as shown in FIG. 3B, colors of images output at two points may be different from each other. This may be viewed as a stain by a user, which becomes a factor that deteriorates the quality of an image output from the display device.

Next, as shown in the graphs of FIGS. 3C and 3D, both when light having a wavelength band of red light is emitted from the display device and when light having a wavelength band of white light is emitted from the display device, the luminance of light output from the display device is considerably changed as the light is distant from the end of the display area. Luminances shown in FIGS. 3C and 3D are relative values based on the luminance of light output at the point distant by 10 mm from the end of the display area. Although not particularly shown in FIGS. 3C and 3D, it is confirmed that the luminance of light output from the display device converges at the point distant by 10 mm from the end of the display area. That is, at a point distant by 10 mm or more from end of the display area, any difference in luminance of light output from the display device depending on the distance from the end of the display area does not substantially exist.

Specifically, referring to FIG. 3C, the luminance of light output from the display device decreases and then increases as the light is distant from the end of the display area. In particular, a change in luminance of light output from the display device is largest in a section in which the distance from the end of the display area is from zero (0) mm to 2 mm. FIG. 3C further show that the luminance of light output at a point distant by about 1.5 mm from the end of the display area is about 0.975, as compared with that the luminance of light output at the end of the display area is about 1.04. Such a luminance difference may be viewed as a stain by a user, which becomes a factor that deteriorates the quality of an image output from the display device.

Next, referring to FIG. 3D, a change in luminance of light depending on the distance from the end of the display area is different from that in FIG. 3C. However, as shown in FIG. 3C, a change in luminance of light output from the display device depending on positions is large. In addition, when the display device emits light having a wavelength band of white light, a change in luminance of light output from the display device is largest in a section in which the distance from the end of the display area is from zero (0) mm to 2 mm. FIG. 3D further show that the luminance of light output at a point distant by about 1.5 mm from the end of the display area is about 1.007, as compared with that the luminance of light output at the end of the display area is about 0.99. Such a luminance difference may be viewed as a stain by a user, which becomes a factor that deteriorates the quality of an image output from the display device.

In a conventional display device, as shown in FIGS. 3B to 3D, the thickness of the encapsulation layer provided at the end of the display area is relatively small, and accordingly, the luminance or color coordinate of light output at the end of the display area is different from other points in the display area. FIGS. 3B to 3D further show that the difference in luminance of light or the difference in color coordinate of light exists regardless of the wavelength band of light output from the display device. Accordingly, the disclosure related to a display device in characteristics of light output is effectively prevented from being changed depending on the distance from the end of the display area and the quality of an image output therefrom is improved.

Figure 4:
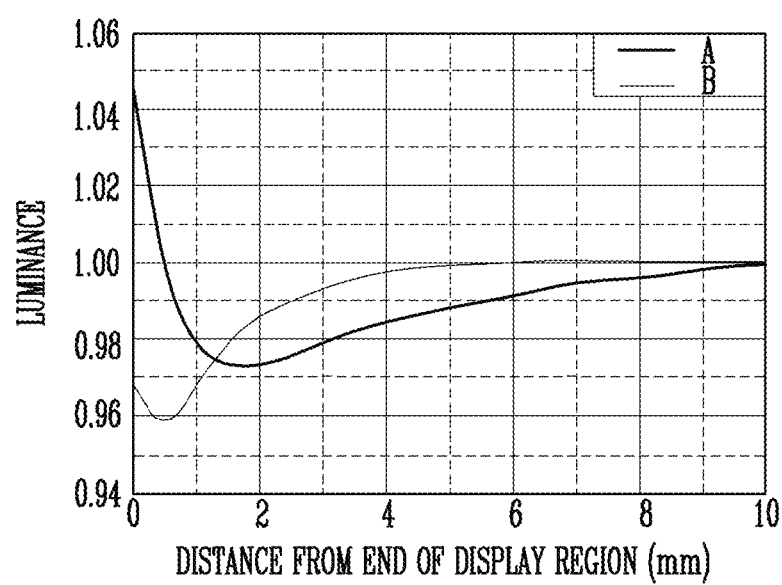
FIG. 4 is a graph illustrating change in luminance of the display device with respect to pixel when the display device emits light having a wavelength band of red light.
Figure 5A:
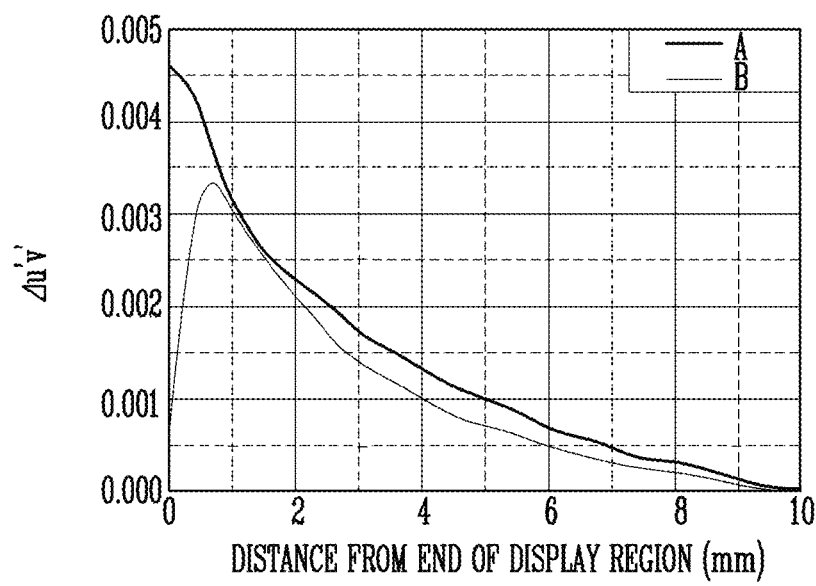
FIGS. 5A and 5B are graphs illustrating change in luminance of the display device with respect to pixel when the display device emits light having a wavelength band of white light.
Figure 5B:
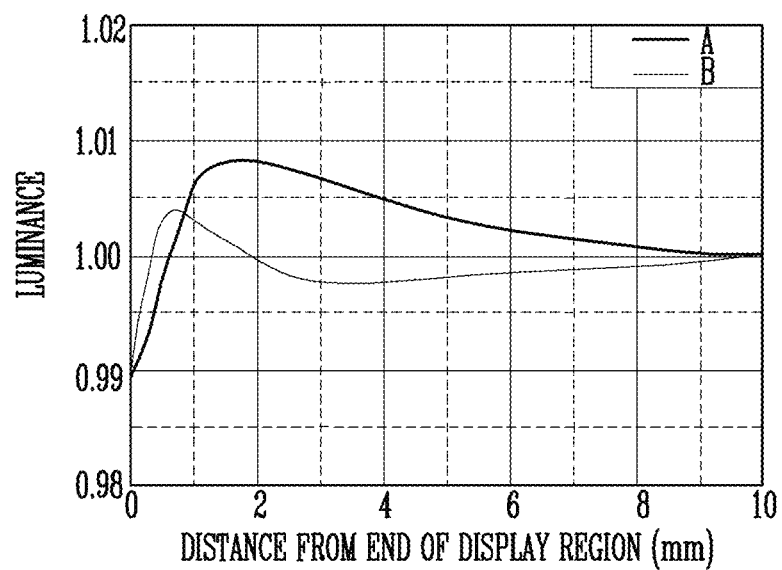

FIG. 4 is a graph illustrating change in luminance of the display device with respect to pixel when the display device emits light having a wavelength band of red light. FIGS. 5A and 5B are graphs illustrating change in luminance of the display device with respect to pixel when the display device emits light having a wavelength band of white light.

The graphs of FIGS. 4, 5A, and 5B illustrate influence of the encapsulation layer on a display device including a pixel that emits light having a relatively long wavelength. FIGS. 4, 5A and 5B relate to a display device A including a comparative embodiment of a pixel, and a display device B including another comparative embodiment of a pixel. Both of the display device A and the display device B include an encapsulation layer according to a conventional art.

Luminances shown in FIGS. 4 and 5B are relative values based on the luminance of light output at the point distant by 10 mm from the end of the display area. Although not shown in FIGS. 4 and 5B, it is confirmed that the luminance of light output from the display device converges at the point distant by 10 mm from the end of the display area. That is, at a point distant by 10 mm or more from end of the display area, any difference in luminance of light output from the display device depending on the distance from the end of the display area does not substantially exist.

FIG. 4 illustrates a case where light having a wavelength band of red light is emitted from the display device. The graph of FIG. 4 illustrates a change in luminance depending on the distance from the end of the display area. The luminance in the display device A may be substantially different from that in the display device B. Specifically, in the display device A, light output according to position in the display area has a luminance difference of a maximum of about 0.07. On the other hand, in the display device B, light output according to position in the display area has a luminance difference of a maximum of about 0.04. Thus, the display device A is further influenced by the thickness of the encapsulation layer. Such a phenomenon occurs even when the pixel emits light having a wavelength band of white light.

FIGS. 5A and 5B illustrate a case where light having a wavelength band of white light is emitted from the display device. The graph of FIG. 5A illustrates a change in color coordinate depending on the distance from the end of the display area, and the graph of FIG. 5B illustrates a change in luminance depending on the distance from the end of the display area.

The display device A has a larger color difference $\Delta u'v'$ according to position as compared with the display device B. Specifically, in the display device A, the light output according to position in the display area has a color difference of a maximum of about 0.0045. On the other hand, in the display device B, the light output according to position in the display area has a color difference of a maximum of about 0.0033.

As for luminance, the display device A has a larger luminance difference as compared with the display device B. Referring to FIG. 5B, in the display device A, the light output according to position in the display area has a luminance difference of a maximum of about 0.018. On the other hand, in the display device B, the light output according to position in the display area has a luminance difference of a maximum of about 0.013. Thus, as shown in FIGS. 5A and 5B, the display device A is further influenced by the thickness of the encapsulation layer.

As described above, FIGS. 4, 5A, and 5B shows that the display device A is further influenced by the thickness of the encapsulation layer as compared with the display device B. Therefore, when the encapsulation layer according to the conventional art is applied to the display device A, the luminance difference or color difference between the end of the display area and another region may be large. Such a luminance difference or color difference may be viewed as a stain by a user, which becomes a factor that deteriorates the quality of an image output from the display device. Accordingly, the display device according to the disclosure is provided to prevent the quality of an image from being deteriorated while using the pixel having high efficiency and long lifespan.

Figure 6A:
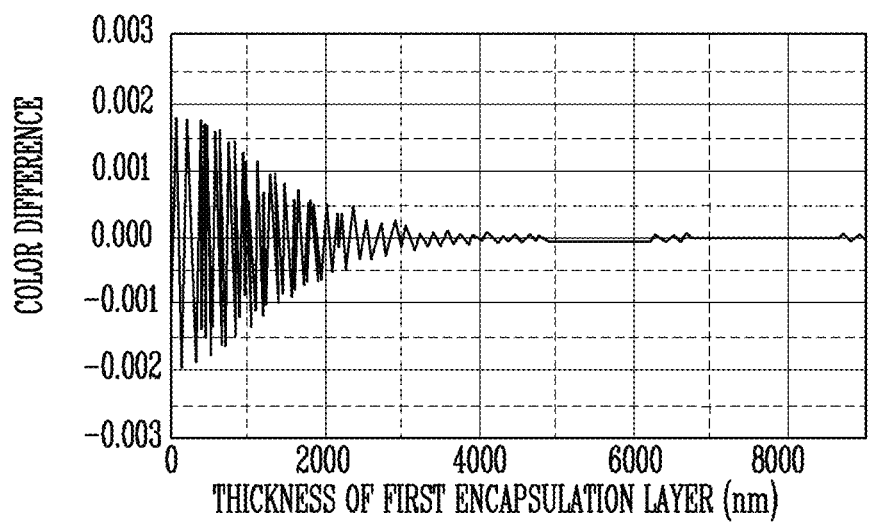
FIGS. 6A and 6B are graphs illustrating color difference and luminance difference with respect to thickness of a first encapsulation layer.
Figure 6B:
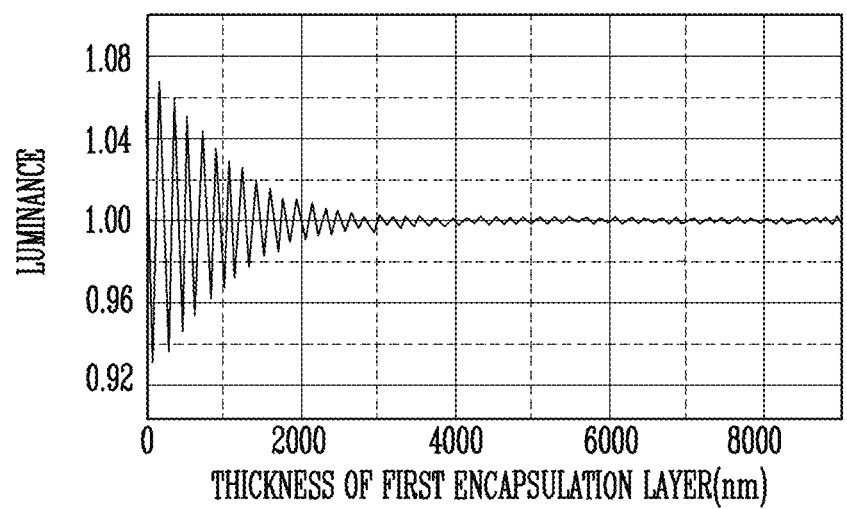

FIGS. 6A and 6B are graphs illustrating color difference and luminance difference with respect to thickness of the first encapsulation layer. In particular, FIGS. 6A and 6B illustrate color difference and luminance difference versus the thickness of the first encapsulation layer when the display device emits light having a wavelength band of red light.

FIG. 6A illustrates color difference versus thickness of the first encapsulation layer. The color difference is the same as a difference between Rx coordinate value in the CIE xy coordinate system. The color difference may be obtained by calculating a difference between an Rx coordinate value of light output at the point distant by about 10 mm from the end of the display area and an Rx coordinate value of light output at the end of the display area. When the distance from the end of the display area is about 10 mm or more, the Rx coordinate value of the output light converges to an arbitrary value according to pixels.

In a region in which the thickness of the first encapsulation layer is less than about 4000 nanometers (nm), the color difference of the output light is considerably changed depending on the thickness of the first encapsulation layer. As shown in FIG. 6A, as the thickness of the first encapsulation layer increases, the color difference of the output light oscillates. A variation in color difference depending on the magnitude of the color difference and the thickness of the first encapsulation layer becomes larger as the thickness of the first encapsulation layer becomes smaller. The oscillation of the color difference is stabilized in a region in which the thickness of the first encapsulation layer is about 4000 nm or more. Therefore, when the thickness of the first encapsulation layer is about 4000 nm or more, any color difference may not occur regardless of the thickness of the first encapsulation layer.

According to an embodiment of the disclosure, the first encapsulation layer may have a thickness in a range of about 1.75 μm to about 4.0 μm. Referring to FIG. 6A, a color difference when the thickness of the first encapsulation layer is about 1.75 μm is about 0.001. The color difference is remarkably small as compared with that of light output from the display device including the encapsulation layer according to the conventional art. Thus, according to an embodiment of the disclosure, an image having a certain color difference value may be output regardless of positions in the display area. In such an embodiment, any stain caused by the color difference is not viewed by a user, such that a high-quality image may be output from the display device. As the thickness of the first encapsulation layer becomes larger than about 1.75 μm, the color difference also become smaller. In an embodiment, as described above, the color difference does not substantially occur when the thickness of the first encapsulation layer is about 4.0 μm (4000 nm) or more. However, when the thickness of the first encapsulation layer exceeds about 4.0 μm as described above, process efficiency may be deteriorated in a manufacturing process of the display device including the first encapsulation layer. Specifically, as the time and resource used for deposition of the first encapsulation layer increases, the manufacturing cost of the display device may increase. Therefore, in an embodiment, the thickness of the first encapsulation layer may be about 4.0 μm or less.

FIG. 6B illustrates luminance (arbitrary unit) versus thickness of the first encapsulation layer. The luminance shown in FIG. 6B represents a relative luminance value at a point at which the luminance difference is largest based on the luminance of light output at a point distant by about 10 mm from the end of the display area. As described above with reference to FIG., the point at which the luminance difference is largest becomes the end of the display area (i.e., a point of 0 mm), and 1.04 that is a luminance at the point becomes the luminance value at the point at which the luminance difference shown in FIG. 6B is largest.

As shown in FIG. 6B, in the region in which the thickness of the first encapsulation layer is less than about 4000 nm, the color difference of the output light is considerably changed depending on the thickness of the first encapsulation layer. As the thickness of the first encapsulation layer increases, the luminance also oscillates. The oscillation of the luminance is stabilized in a region in which the thickness of the first encapsulation layer is about 4000 nm or more. Therefore, when the thickness of the first encapsulation layer is about 4000 nm or more, any luminance difference may not occur in the entire display area regardless of the thickness of the first encapsulation layer.

According to an embodiment of the disclosure, the first encapsulation layer may have a thickness in a range of about 1.75 μm to about 4.0 μm. Referring to FIG. 6B, the luminance at a point at which the luminance difference is largest when the thickness of the first encapsulation layer is about 1.75 μm is about 1.02. The luminance is remarkably small as compared with 1.04 that is a luminance at a point at which the luminance difference is largest in the display device including the encapsulation layer according to the conventional art. Thus, according to an embodiment of the disclosure, an image having a certain luminance may be output regardless of positions in the display area. In such an embodiment, any stain caused by the luminance difference is not viewed by a user, such that a high-quality image may be output from the display device. As the thickness of the first encapsulation layer becomes larger than about 1.75 μm, the luminance difference also become smaller. As described above, the luminance difference does not substantially occur when the thickness of the first encapsulation layer is about 4.0 μm (4000 nm) or more. However, when the thickness of the first encapsulation layer exceeds about 4.0 μm as described above, process cost may increase. Therefore, in an embodiment, the thickness of the first encapsulation layer may be about 4.0 μm or less.

In an embodiment of the disclosure, the ratio of the thickness of the second region of the encapsulation layer to the thickness of the first region of the encapsulation layer is in a range of 0.95 to 1.0. Here, the thickness of the first region of the encapsulation layer and the thickness of the second region of the encapsulation layer may be defined as average thicknesses of the entire portions of the encapsulation layers in the respective regions. As shown in FIG. 6A or 6B, when the thickness range of the encapsulation layer is less than about 4.0 μm, the color difference and luminance difference may oscillate according to the thickness of the encapsulation layer. Therefore, as the difference in thickness between the encapsulation layers respectively in the second region and the first region becomes smaller, the color difference and luminance difference between lights respectively output from the two regions may become smaller. According to an embodiment of the disclosure, the ratio of the thickness of the second region of the encapsulation layer (i.e., the portion of the encapsulation layer in the second region) to the thickness of the first region of the encapsulation layer (i.e., the portion of the encapsulation layer in the first region) is in a range of 0.95 to 1.0, such that the difference in thickness between the encapsulation layers respectively in the second region and the first region is relatively small. Thus, in such an embodiment of the disclosure, an image having uniform color and luminance can be output regardless of positions in the display area.

Figure 7A:
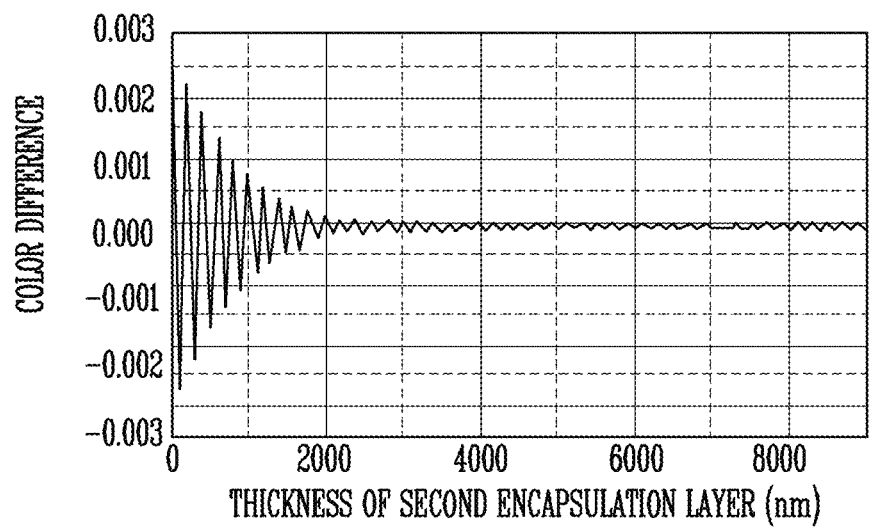
FIGS. 7A and 7B are graphs illustrating color difference and luminance difference with respect to thickness of a second encapsulation layer.
Figure 7B:
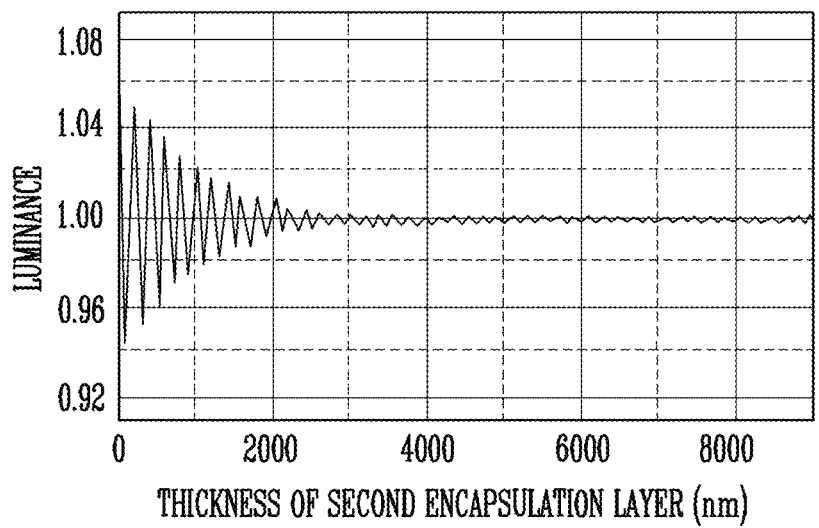

FIGS. 7A and 7B are graphs illustrating color difference and luminance difference with respect to thickness of the second encapsulation layer. Specifically, FIGS. 7A and 7B illustrate color difference and luminance difference versus the thickness of the second encapsulation layer on the first encapsulation layer having a thickness in range of about 1.75 μm to about 4.0 μm. In particular, FIGS. 7A and 7B illustrate color difference and luminance difference versus the thickness of the second encapsulation layer when the display device emits light having a wavelength band of red light.

FIG. 7A illustrates color difference versus the thickness of the second encapsulation layer. The color difference is the same as a difference between Rx coordinate value in the CIE xy coordinate system. The color difference may be obtained by calculating a difference between an Rx coordinate value of light output at the point distant by about 10 mm from the end of the display area and an Rx coordinate value of light output at the end of the display area.

In a region in which the thickness of the second encapsulation layer is less than about 2.5 μm (2500 nm), the color difference of the output light is considerably changed depending on the thickness of the second encapsulation layer. Specifically, as the thickness of the second encapsulation layer increases, the color difference of the output light oscillates. The oscillation of the color difference is stabilized in a region in which the thickness of the second encapsulation layer is about 2500 nm or more. The change in color difference depending on the thickness of the second encapsulation layer is similar to that in color difference depending on the thickness of the first encapsulation layer. However, in FIG. 7A, since the display device includes the first encapsulation layer having a thickness in a range of about 1.75 μm to about 4.0 μm, the change in color difference depending on the thickness of the second encapsulation layer is relatively small.

According to an embodiment of the disclosure, the second encapsulation layer may have a thickness of about 2.5 μm or more. As shown in FIG. 7A, the color difference hardly occurs in a region in which the thickness of the second encapsulation layer is 2.5 μm or more. In such an embodiment, where the thickness of the second encapsulation layer is about 2.5 μm or more, occurrence of a color difference is effectively prevented, and no stain is thereby viewed by a user. However, those skilled in the art may adjust the thickness of the second encapsulation layer at a level where process cost is not considerably increased.

FIG. 7B illustrates luminance (arbitrary unit) according to thickness of the second encapsulation layer. The luminance shown in FIG. 7B represents a relative luminance value at a point at which the luminance difference is largest based on the luminance of light output at a point distant by about 10 mm from the end of the display area.

As shown in FIG. 7B, in the region in which the thickness of the second encapsulation layer is less than about 2.5 μm (2500 nm), the color difference of the output light is considerably changed depending on the thickness of the second encapsulation layer. The luminance also oscillates as the thickness of the second encapsulation layer increases. The oscillation of the luminance is stabilized in a region in which the thickness of the second encapsulation layer is about 2500 nm or more. The change in luminance depending on the thickness of the second encapsulation layer is similar to that in luminance depending on the thickness of the first encapsulation layer. However, in FIG. 7B, since the display device includes the first encapsulation layer having a thickness in a range of about 1.75 μm to about 4.0 μm, the change in color difference depending on the thickness of the second encapsulation layer is relatively small.

According to an embodiment of the disclosure, the second encapsulation layer may have a thickness of about 2.5 μm or more. As shown in FIG. 7B, the luminance difference according to positions in the display area hardly occurs in a region in which the thickness of the second encapsulation layer is 2.5 μm or more. Thus, in an embodiment, where the thickness of the second encapsulation layer is set to be about 2.5 μm or more, occurrence of a luminance difference according to positions in the display area is effectively prevented, and no stain is thereby viewed by a user. However, those skilled in the art may adjust the thickness of the second encapsulation layer at a level where process cost is not considerably increased.

Figure 8A:
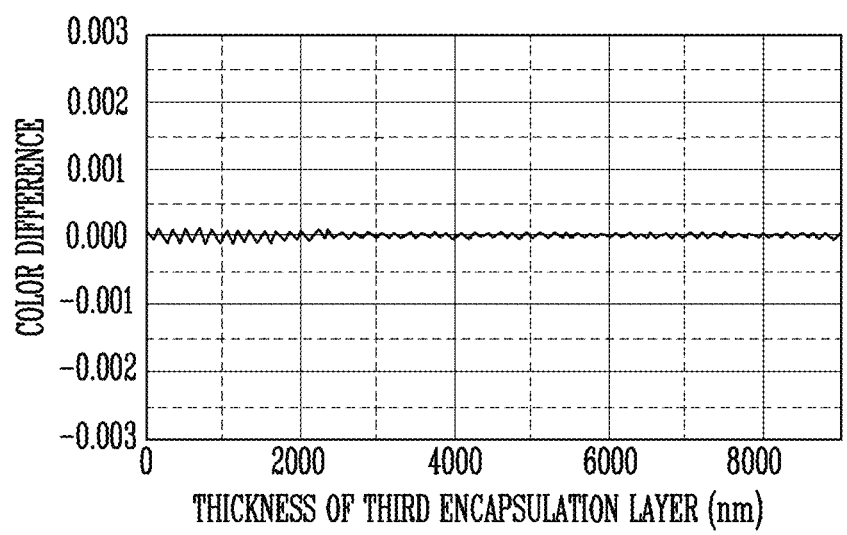
FIG. 8A and 8B are graphs illustrating color difference and luminance difference with respect to thickness of a third encapsulation layer.
Figure 8B:
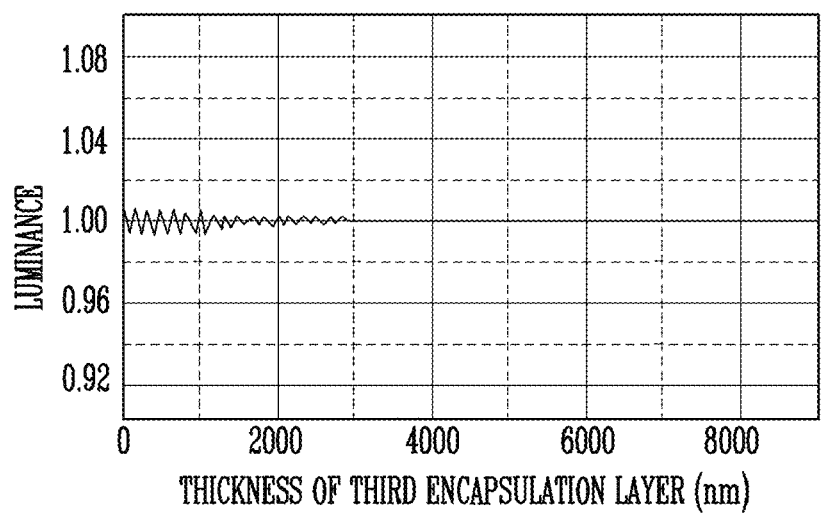

FIG. 8A and 8B are graphs illustrating color difference and luminance difference (arbitrary units) with respect to thickness of the third encapsulation layer. Specifically, FIGS. 8A and 8B illustrate color difference and luminance versus thickness of the third encapsulation layer on the first encapsulation layer having thickness in a range of about 1.75 μm to about 4.0 μm and the second encapsulation layer having thickness in a range of about 2.5 μm or more. The display device of FIGS. 8A and 8B emits light having a wavelength band of red light. In addition, numerical values of color difference and luminance on the y axis of the graph are the same as described in FIGS. 6A and 6B.

FIG. 8A illustrates color difference versus thickness of the third encapsulation layer. As shown in FIG. 8A, the color difference of the output light oscillates as the thickness of the third encapsulation layer increases. However, as shown in FIG. 8A, since the display device includes the first encapsulation layer having a thickness in a range of about 1.75 μm to about 4.0 μm and the second encapsulation layer having a thickness in a range of about 2.5 μm or more, a change in color difference depending on the thickness of the third encapsulation layer is relatively small.

According to an embodiment of the disclosure, the third encapsulation layer may have a thickness in a range of about 1.75 μm to about 4.0 μm. In such an embodiment, the third encapsulation layer has a thickness of about 1.75 μm or more, such that the occurrence of a color difference according to positions in the display area may be minimized. In such an embodiment, the third encapsulation layer has a thickness of about 4.0 μm or less, such that process cost increase due to forming the third encapsulation layer with a thick thickness is effectively prevented.

FIG. 8B illustrates luminance difference versus thickness of the third encapsulation layer. According to FIG. 8B, the luminance of the output light oscillates as the thickness of the third encapsulation layer increases. However, as shown in FIG. 8B, since the display device includes the first encapsulation layer having a thickness in a range of about 1.75 μm to about 4.0 μm and the second encapsulation layer having a thickness in a range of about 2.5 μm or more, a change in luminance depending on the thickness of the third encapsulation layer is relatively small.

According to an embodiment of the disclosure, the third encapsulation layer may have a thickness of about 1.75 μm to about 4.0 μm. In such an embodiment, the third encapsulation layer has a thickness of about 1.75 μm or more, such that the occurrence of a luminance difference according to positions in the display area can be minimized. In such an embodiment, the third encapsulation layer has a thickness of about 4.0 µm or less, such that process cost increase due to forming the third encapsulation layer with a thick thickness is effectively prevented.

According to embodiments of the disclosure, it is possible to provide a display device which has no color difference and no luminance difference and can output an image having excellent image quality.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the disclosure as set forth in the following claims.

What is claimed is:

1. A display device comprising:
a substrate on which a display area and a non-display area are defined;
a plurality of pixels disposed on the substrate in the display area; and
an encapsulation layer disposed on the pixels to cover the pixels, wherein the encapsulation layer includes a first region and a second region different from the first region,
wherein the encapsulation layer has a multi-layer structure including a first encapsulation layer, a second encapsulation layer, and a third encapsulation layer, wherein each of the first encapsulation layer and the third encapsulation layer has a thickness in a range of about 1.75 micrometers to about 4.0 micrometers,
wherein the ratio of a thickness of the second region of the each of the first encapsulation layer and the third encapsulation layer to a thickness of the first region of the each of the first encapsulation layer and the third encapsulation layer is in a range of about 0.95 to about 1.0,
wherein at least portions of respective major surface planes defining the first encapsulation layer and the third encapsulation layer are in direct contact with each other in the second region disposed in the display area.

2. The display device of claim 1, wherein
the second region of the encapsulation layer is disposed along an edge of the display area, and
the first region of the encapsulation layer is surrounded by the second region.

3. The display device of claim 1, wherein a width of the second region of the encapsulation layer is smaller than a width of the first region of the encapsulation layer.

4. The display device of claim 3, wherein, the thickness of the second region of the encapsulation layer becomes smaller as the second region of the encapsulation layer is closer to the edge of the display area.

5. The display device of claim 1, wherein the first region of the encapsulation layer has a flat surface parallel to a top surface of the substrate.

6. The display device of claim 1,
wherein at least one of the first, the second, and the third encapsulation layers includes an organic material.

7. The display device of claim 1, wherein
the first encapsulation layer including a first inorganic material, the second encapsulation layer including an organic material, and the third encapsulation layer including a second inorganic material are sequentially stacked on one another.

8. The display device of claim 7, wherein
the second encapsulation layer has a thickness of about 2.5 micrometers or more.

9. The display device of claim 1, wherein a luminance difference between light transmitted through the first region of the encapsulation layer and light transmitted through the second region of the encapsulation layer is about 2% or less.

10. The display device of claim 1, wherein
the pixel emits light having a wavelength band of at least one color of red, green, blue, white, yellow, cyan and magenta, and
a color difference between light transmitted through the first region of the encapsulation layer and light transmitted through the second region of the encapsulation layer is about 0.001 or less.

11. The display device of claim 1, wherein the pixel includes:
a first electrode disposed on the substrate;
an emitting layer disposed on the first electrode; and
a second electrode disposed on the emitting layer.

12. The display device of claim 11, wherein
the first electrode is an anode, and
the second electrode is a cathode.

13. The display device of claim 1, wherein the first region and the second region of the encapsulation are disposed in the display area.

14. The display device of claim 13, wherein a portion of the encapsulation layer is disposed in the non-display area.

15. The display device of claim 14, wherein the portion of the encapsulation layer disposed in the non-display area includes an inorganic material.

16. A display device comprising:
a substrate on which a display area and a non-display area are defined;
a plurality of pixels disposed on the substrate in the display area; and
an encapsulation layer disposed on the pixels to cover the pixels, wherein the encapsulation layer includes a first region and a second region different from the first region,
wherein
the ratio of a thickness of the second region of each layer defining the encapsulation layer to a thickness of the first region of the each layer defining the encapsulation layer is in a range of about 0.95 to about 1.0,
the encapsulation layer has a multi-layer structure including three or more encapsulation layers, in which a first encapsulation layer, a second encapsulation layer, and a third encapsulation layer are sequentially stacked on one another,
the first encapsulation layer and the third encapsulation layer each has a thickness in a range of about 1.75 micrometers to about 4.0 micrometers, and
the second encapsulation layer has a thickness of about 2.5 micrometers or more.

* * * * *